United States Patent
Wong et al.

(10) Patent No.: US 8,035,453 B1
(45) Date of Patent: Oct. 11, 2011

(54) TECHNIQUES RELATING TO OSCILLATORS

(75) Inventors: Wilson Wong, San Francisco, CA (US);
Allen Chan, San Jose, CA (US);
Simardeep Maangat, Sunnyvale, CA (US); Sergey Shumarayev, Los Altos Hills, CA (US)

(73) Assignee: Altera Corporation, San Jose, CA (US)

( * ) Notice: Subject to any disclaimer, the term of this patent is extended or adjusted under 35 U.S.C. 154(b) by 75 days.

(21) Appl. No.: 12/577,568

(22) Filed: Oct. 12, 2009

(51) Int. Cl.
*H03K 3/03* (2006.01)
*H03L 1/00* (2006.01)
*H03L 7/099* (2006.01)

(52) U.S. Cl. .......... 331/57; 331/186; 327/158; 327/277; 327/280

(58) Field of Classification Search .......... 331/45, 331/57, 185, 186; 327/149, 153, 158, 161, 327/266, 269–272, 274, 276–278, 280, 281, 327/284, 285, 287, 288
See application file for complete search history.

(56) References Cited

U.S. PATENT DOCUMENTS

| | | | |
|---|---|---|---|
| 5,568,099 A | 10/1996 | Du | |
| 5,847,617 A * | 12/1998 | Reddy et al. | 331/57 |
| 6,756,828 B2 * | 6/2004 | Lee et al. | 327/156 |
| 7,202,726 B2 | 4/2007 | Kunanayagam et al. | |
| 7,342,465 B2 | 3/2008 | Seefeldt | |
| 7,701,301 B2 * | 4/2010 | Lakshmikumar et al. | 331/57 |
| 7,728,674 B1 * | 6/2010 | Hoang et al. | 331/2 |
| 2005/0156678 A1 | 7/2005 | Lu | |
| 2009/0267698 A1 * | 10/2009 | Lin | 331/57 |

* cited by examiner

*Primary Examiner* — Levi Gannon
(74) *Attorney, Agent, or Firm* — Steven J. Cahill

(57) ABSTRACT

An oscillator circuit includes differential variable delay circuits coupled together to form a ring oscillator. Each of the differential variable delay circuits has first and second inputs and first, second, third, and fourth transistors. A constant supply voltage is provided to sources of the first and the second transistors in each of the differential variable delay circuits. A variable supply voltage is provided to sources of the third and the fourth transistors in each of the differential variable delay circuits. Gates of the first and the third transistors are coupled to the first input. Gates of the second and the fourth transistors are coupled to the second input. The oscillator circuit generates a periodic output signal having a frequency that varies based on changes in the variable supply voltage.

20 Claims, 6 Drawing Sheets

TECHNIQUES RELATING TO OSCILLATORS

BACKGROUND

The present invention relates to electronic circuits, and more particularly to techniques relating to oscillators.

FIG. 1 illustrates a configuration of a prior art voltage-controlled oscillator (VCO) 104. VCO 104 is part of a phase-locked loop (PLL) circuit. The PLL includes a PLL loop filter 101, a voltage buffer 102, a low pass filter (LPF) 103, and a VCO 104. PLL loop filter 101 generates a control voltage VCL that is based on the difference between the phase and the frequency of a reference clock signal and the phase and the frequency of a feedback clock signal. Voltage buffer 102 buffers VCL to generate an oscillator supply voltage VOS.

A supply voltage VCC is filtered by LPF 103 to generate a filtered supply voltage VFL. The filtered supply voltage VFL is provided to a supply input of voltage buffer 102. VCO 104 is a ring oscillator that includes two differential VCO cells 105-106. VCO cells 105-106 are differential inverting delay circuits. The oscillator supply voltage VOS is provided to supply inputs of VCO cells 105 and 106. VCO cell 106 generates a differential output signal OUT/OUTB.

FIG. 2 is a schematic diagram of a prior art VCO cell that is used to implement VCO 104. The VCO cell circuit structure shown in FIG. 2 is in VCO cell 105. The VCO cell circuit structure shown in FIG. 2 is also in VCO cell 106. VCO cell 105/106 includes p-channel metal oxide semiconductor field-effect transistors (MOSFETs) 201-202 and n-channel MOSFETs 203-206. INP is the non-inverting (+) input of VCO cell 105/106, and INN is the inverting (−) input of VCO cell 105/106. OUTP is the non-inverting output of VCO cell 105/106, and OUTN is the inverting output of VCO cell 105/106. The inverting outputs of VCO cells 105/106 are represented by circles in VCO 104. The oscillator supply voltage VOS is provided to the sources of transistors 201-202.

FIG. 3 is a graph that illustrates the frequency response and the gain of VCO 104. The frequency response of VCO 104 refers to the frequency of differential output signal OUT/OUTB. The gain (KVCO) of VCO 104 refers to the change in frequency of OUT/OUTB versus the change in the control voltage VCL. VCO 104 provides a tuning range for OUT/OUTB from about 1-14 GHz as shown in FIG. 3. The gain of VCO 104 varies from about 7 GHz/volt to a maximum of about 12 GHz/volt over the tuning range of VCO 104.

VCO 104 is very susceptible to generating jitter in output signals OUT and OUTB in response to supply voltage noise in VOS, particularly at high frequencies. Noise in VOS can, for example, be generated in response to noise in VFL or noise in VCL.

BRIEF SUMMARY

According to some embodiments, an oscillator circuit includes differential variable delay circuits coupled together to form a ring oscillator. Each of the differential variable delay circuits has first and second inputs and first, second, third, and fourth transistors. A constant supply voltage is provided to sources of the first and the second transistors in each of the differential variable delay circuits. A variable supply voltage is provided to sources of the third and the fourth transistors in each of the differential variable delay circuits. Gates of the first and the third transistors are coupled to the first input. Gates of the second and the fourth transistors are coupled to the second input. The oscillator circuit generates a periodic output signal having a frequency that varies based on changes in the variable supply voltage.

In other embodiments, a phase-locked loop circuit includes phase detection circuitry, a voltage buffer, and variable delay circuits. The phase detection circuitry generates a control voltage that varies based on changes in a phase difference between two clock signals. The voltage buffer generates a variable supply voltage that is based on the control voltage using current that is supplied from a supply source. The variable delay circuits are coupled together to form a ring oscillator. The variable supply voltage is provided to first and second transistors in each of the variable delay circuits. A constant supply voltage is provided to third and fourth transistors in each of the variable delay circuits. The ring oscillator generates a minimum frequency of oscillation in a periodic output signal using the constant supply voltage when the voltage buffer blocks current from the supply source through the first and the second transistors.

Various objects, features, and advantages of the present invention will become apparent upon consideration of the following detailed description and the accompanying drawings.

DETAILED DESCRIPTION

Figure 4:
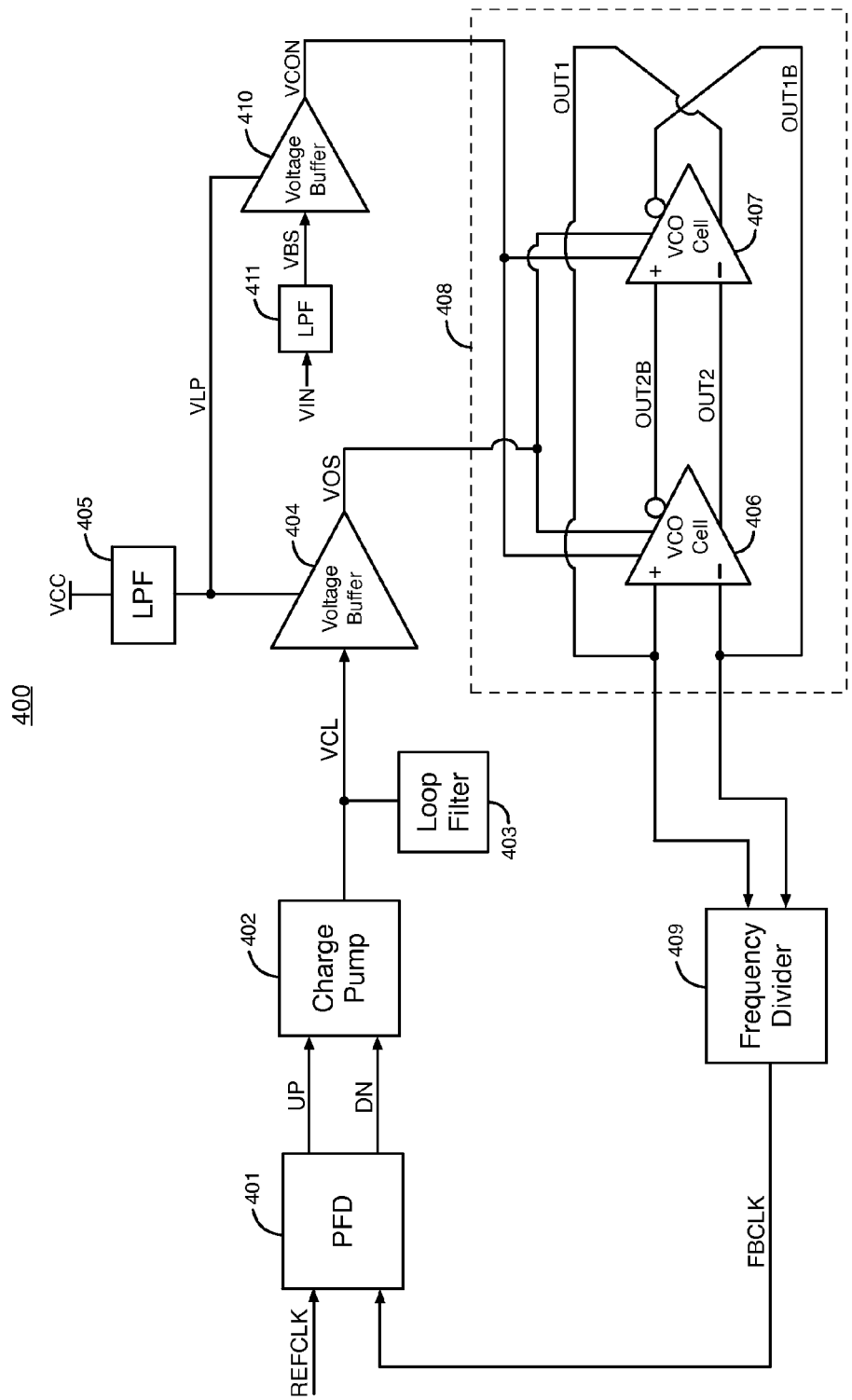
FIG. 4 illustrates an example of a phase-locked loop (PLL) circuit, according to an embodiment of the present invention.

FIG. 4 illustrates an example of a phase-locked loop (PLL) circuit 400, according to an embodiment of the present invention. PLL 400 includes phase frequency detector (PFD) circuit 401, charge pump circuit 402, loop filter circuit 403, voltage buffer circuit 404, low pass filter (LPF) circuit 405, voltage-controlled oscillator (VCO) circuit 408, frequency divider circuit 409, voltage buffer 410, and LPF 411. VCO 408 includes VCO cells 406 and 407 that are coupled together to form a ring oscillator.

PLL 400 is typically fabricated on an integrated circuit. PLL 400 can, for example, be fabricated on an application specific integrated circuit (ASIC), a field programmable gate array (FPGA), a programmable logic device (PLD), a memory integrated circuit, a processor or controller integrated circuit, an analog integrated circuit, etc.

Phase-frequency detector (PFD) 401 compares the phase and the frequency of an input reference clock signal REFCLK to the phase and the frequency of a feedback clock signal FBCLK generated by frequency divider 409. PFD 401 generates UP and DN (down) error signals that are indicative of the differences between the phases and the frequencies of the input reference clock signal REFCLK and the feedback clock signal FBCLK. The UP and DN error signals are transmitted to charge pump 402. Charge pump 402 converts the UP and DN error signals into a control voltage VCL, and loop filter 403 filters the control voltage VCL. Loop filter 403 is a low pass filter that attenuates high frequency components of control voltage VCL.

Low pass filter (LPF) 405 filters a supply voltage VCC to generate a filtered supply voltage VLP. Supply voltage VLP is provided to a supply input of voltage buffer 404 and to a supply input of voltage buffer 410.

The control voltage VCL is transmitted to a control input of voltage buffer 404. Voltage buffer 404 buffers VCL to generate an oscillator supply voltage VOS. Oscillator supply voltage VOS is transmitted to first supply inputs of VCO cells 406 and 407 in voltage-controlled oscillator (VCO) 408. Each of the VCO cells 406 and 407 is a differential variable delay circuit. The delays of VCO cells 406-407 vary based on changes in the oscillator supply voltage VOS.

Voltage buffer 404 can, for example, be a native n-channel MOSFET having a low threshold voltage near zero volts. In this example, VCL is provided to the gate of the n-channel MOSFET, VLP is provided to the drain of the n-channel MOSFET, and VOS is generated at the source of the n-channel MOSFET.

VCO 408 generates two differential output clock signals OUT1/OUT1B and OUT2/OUT2B. The first differential output clock signal OUT1/OUT1B is generated at the outputs of VCO cell 407, and the second differential output clock signal OUT2/OUT2B is generated at the outputs of VCO cell 406. Signals OUT2 and OUT2B are 180 degrees out of phase from each other. Signals OUT1 and OUT are also 180 degrees out of phase from each other. Signals OUT1 and OUT2 are offset in phase by 90 degrees from each other. Signals OUT1, OUT2, OUT1B, and OUT2B have relative phases of 0°, 90°, 180°, and 270°.

VCO 408 varies the frequency of its differential output clock signals OUT1/OUT1B and OUT2/OUT2B within a frequency range based on changes in the oscillator supply voltage VOS. VOS varies based on changes in the control voltage VCL.

Frequency divider circuit 409 divides the frequency of the OUT1/OUT1B clock signal from VCO 408 to generate the feedback clock signal FBCLK. Frequency divider 409 can be, for example, a divide-by-N counter circuit. Frequency divider 409 allows VCO 408 to generate output clock signals having frequencies greater than the frequency of the input reference clock signal REFCLK.

PLL 400 adjusts the control voltage VCL until both the phase and the frequency of feedback clock signal FBCLK match the phase and the frequency of reference clock signal REFCLK. When the frequency of clock signal REFCLK is greater than the frequency of clock signal FBCLK, PFD 401 generates high pulses in the UP signal that are longer than high pulses in the DN signal. Charge pump 402 increases control voltage VCL in response to high pulses in the UP signal that are longer than high pulses in the DN signal. Voltage buffer 404 increases voltage VOS in response to the increase in control voltage VCL. VCO 408 increases the frequency of clock signals OUT1/OUT1B and OUT2/OUT2B in response to the increase in voltage VOS. The frequency of FBCLK increases in response to the increased frequency of OUT1/OUT1B.

When the frequency of clock signal FBCLK is greater than the frequency of clock signal REFCLK, PFD 401 generates high pulses in the DN signal that are longer than high pulses in the UP signal. Charge pump 402 decreases control voltage VCL in response to high pulses in the DN signal that are longer than high pulses in the UP signal. Voltage buffer 404 decreases voltage VOS in response to the decrease in control voltage VCL. VCO 408 decreases the frequency of clock signals OUT1/OUT1B and OUT2/OUT2B in response to the decrease in voltage VOS. The frequency of FBCLK decreases in response to the decreased frequency of OUT1/OUT1B. PLL 400 maintains VCL and VOS constant when FBCLK and REFCLK are aligned in phase and have the same frequency. VCO 408 maintains the frequency of its output clock signals constant in response to VOS remaining at a constant voltage.

Low pass filter 411 filters high frequency noise from an input voltage VIN to generate a bias voltage VBS that is transmitted to a control input of voltage buffer 410. Voltage buffer 410 generates a constant supply voltage VCON at its output. The voltage of VCON is based on the voltage VBS at the control input of buffer 410 and the voltage VLP at the supply input of buffer 410. The constant supply voltage VCON is provided to second supply inputs of VCO cells 406-407, as shown in FIG. 4.

Voltage buffer 410 can be, for example, a native n-channel MOSFET having a low threshold voltage near zero volts. The native n-channel MOSFET in voltage buffer 410 has a drain that receives voltage VLP, a gate that receives voltage VBS, and a source that generates voltage VCON.

Figure 5:
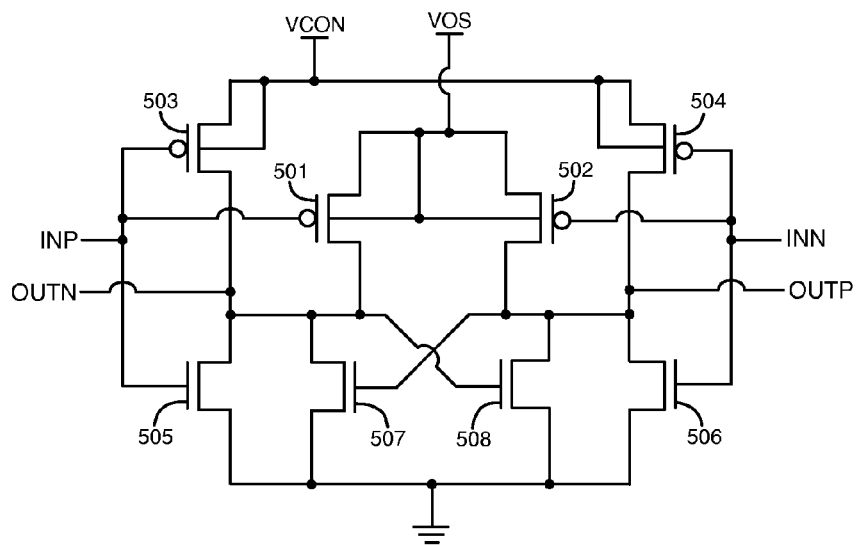
FIG. 5 is a schematic diagram that illustrates an example of a VCO cell in the VCO shown in FIG. 4, according to an embodiment of the present invention.

FIG. 5 is a schematic diagram that illustrates an example of a VCO cell, according to an embodiment of the present invention. VCO cell 406 has the VCO cell circuit architecture shown in FIG. 5. VCO cell 407 has the VCO cell circuit architecture shown in FIG. 5. Thus, each of the VCO cells 406 and 407 in VCO 408 has the VCO cell circuit structure shown in FIG. 5.

The VCO cell shown in FIG. 5 includes p-channel metal oxide semiconductor field-effect transistors (MOSFETs) 501-504 and n-channel MOSFETs 505-508. INP is the non-inverting (+) input of VCO cell 406/407, and INN is the inverting (−) input of VCO cell 406/407. OUTP is the non-inverting output of VCO cell 406/407, and OUTN is the inverting output of VCO cell 406/407. The inverting outputs of VCO cells 406-407 are represented by circles in FIG. 4.

The gates of transistors 501, 503, and 505 are coupled to input INP, and the gates of transistors 502, 504, and 506 are coupled to input INN. The drains of transistors 501, 503, 505, and 507 are coupled to output OUTN. The drains of transistors 502, 504, 506, and 508 are coupled to output OUTP. Transistors 507 and 508 are cross-coupled with each other. The sources of transistors 505-508 are at a ground voltage. The oscillator supply voltage VOS is provided to the source and bulk terminals of transistors 501-502. The constant supply voltage VCON is provided to the source and bulk terminals of transistors 503-504.

Transistors 503 and 505 function as a first inverter, and transistors 504 and 506 function as a second inverter. When the voltage at INN is in a logic high state, and the voltage at INP is in a logic low state, the VCO cell of FIG. 5 pulls the voltage at OUTP to a logic low state and the voltage at OUTN to a logic high state. Conversely, when the voltage at INN is in a logic low state, and the voltage at INP is in a logic high state, the VCO cell of FIG. 5 pulls the voltage at OUTP to a logic high state and the voltage at OUTN to a logic low state. Cross-coupled transistors 507 and 508 cause the differential output voltages of the VCO cell at outputs OUTP and OUTN to have opposite polarities, so that VCO 408 generates oscillating clock signals.

The constant supply voltage VCON generated at the output of voltage buffer 410 is a programmable voltage. The voltage of VCON can be programmed to a different value by varying the programmable voltage of VIN. The voltage of VCON is programmed to a desired value prior to the operation of PLL 400. During the operation of PLL 400 when VCO 408 is generating oscillating output clock signals, VCON remains at a constant voltage. If appropriate voltages are selected for VIN, VBS, and VLP, and voltage buffer 410 is an n-channel transistor, the n-channel transistor in buffer 410 prevents backflow current from VCO 408 to LPF 405 when VOS increases above VCON.

The voltage of VCON and the voltage range of VOS determine the frequency range that VCO 408 generates in its output clock signals OUT1/OUT1B and OUT2/OUT2B. The frequency of the output clock signals of delay cells 406-407 varies based on changes in the oscillator supply voltage VOS. The voltage of VCON determines the starting frequency and the minimum frequency of the output clock signals OUT1/OUT1B and OUT2/OUT2B of VCO 408. The current supplied from voltage buffer 410 allows VCO 408 to generate a minimum frequency of oscillation in output clock signals OUTVOUT1B and OUT2/OUT2B when voltage buffer 404 is off and not providing current from LPF 405 to VCO 408. Voltage buffer 404 may be off if voltage VCL is too low to turn voltage buffer 404 on.

VCON can be programmed to set a desired minimum frequency for the output clock signals of VCO 408. For example, VCON can be programmed to be a voltage between 0 and 1.5 volts, and VCL can vary between 0.4 and 1.6 volts during the operation of PLL 400.

The constant supply voltage VCON is maintained at a large enough voltage during the operation of PLL 400 to allow transistors 503-504 and transistors 505-508 to be switched on and off. As a result, VCO delay cells 406 and 407 generate oscillations in output clock signals OUT1/OUT1B and OUT2/OUT2B using current from voltage buffer 410, even when the voltage of VOS is not large enough by itself to generate oscillations in output clock signals OUT1/OUT1B and OUT2/OUT2B. Providing a supply voltage VCON to transistors 503-504 that is large enough to allow transistors 503-508 to be switched on and off increases the minimum frequency that VCO 408 generates in output clock signals OUT1/OUT1B and OUT2/OUT2B.

Figure 1:
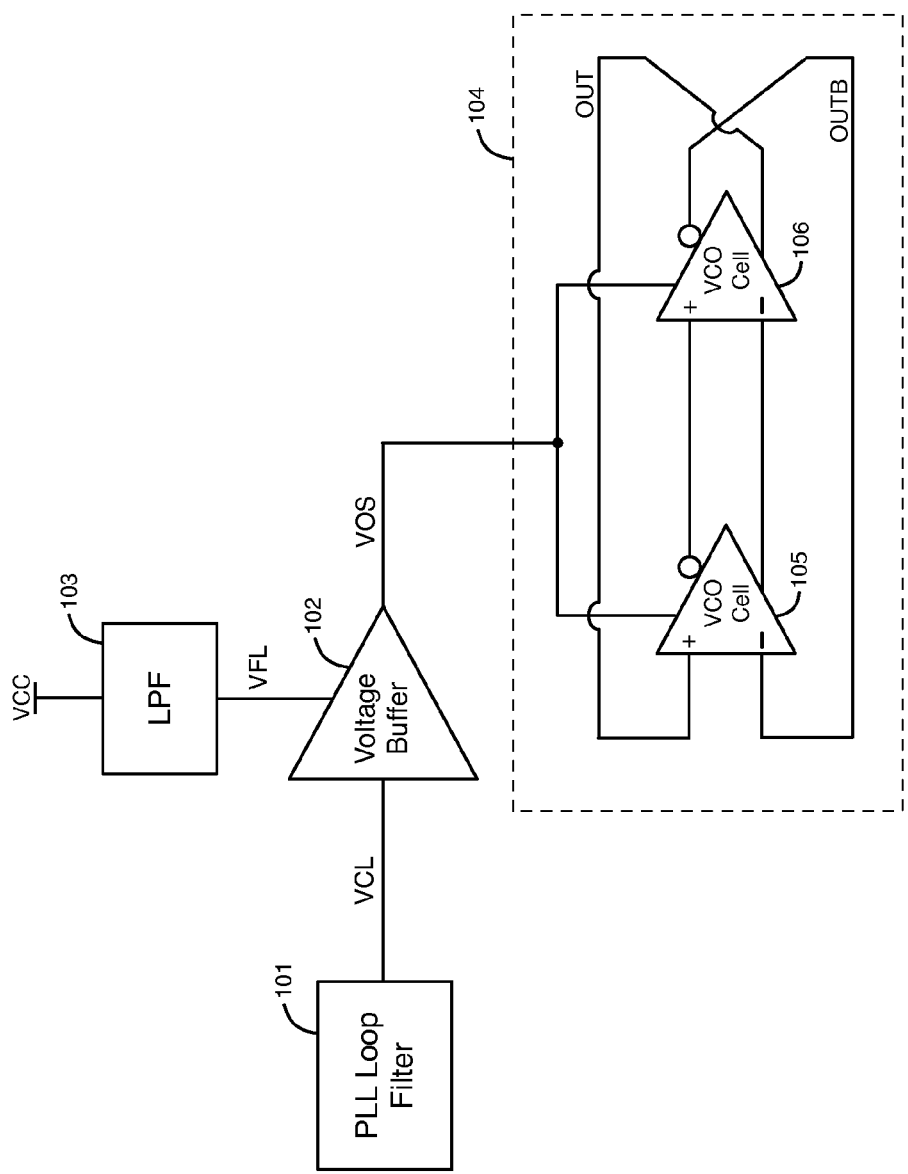
FIG. 1 illustrates a configuration of a prior art voltage-controlled oscillator (VCO).
Figure 2:
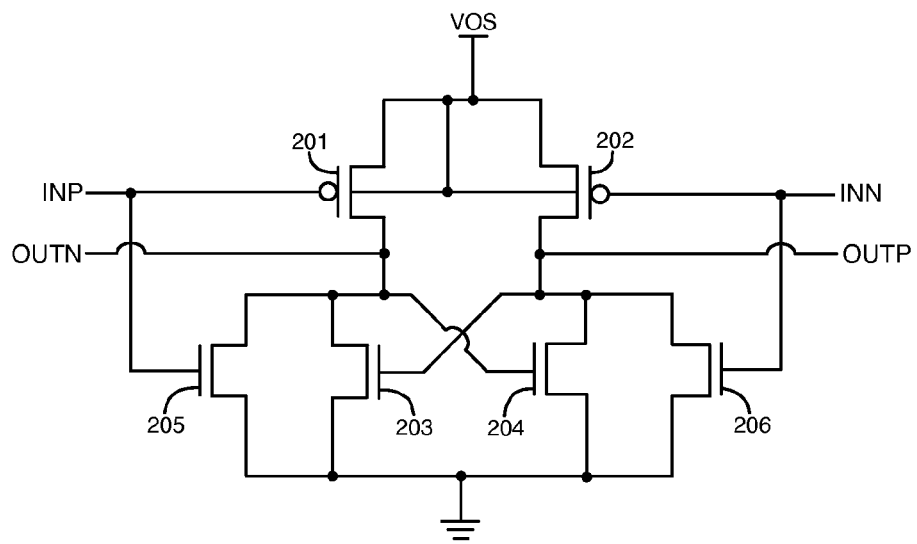
FIG. 2 is a schematic diagram of a prior art VCO cell that is used to implement the VCO shown in FIG. 1.

Providing a constant supply voltage VCON to transistors 503-504 also reduces the tuning range of frequencies that VCO 408 generates in its output clock signals. Because the frequency tuning range of VCO 408 is reduced, the gain of VCO 408 is reduced relative to VCO 104 in FIG. 1. The reduction in the gain of VCO 408 causes VCO 408 to be less sensitive to supply voltage noise and parasitic coupling. As a result, VCO 408 generates significantly less jitter in its output clock signals than VCO 104.

Figure 3:
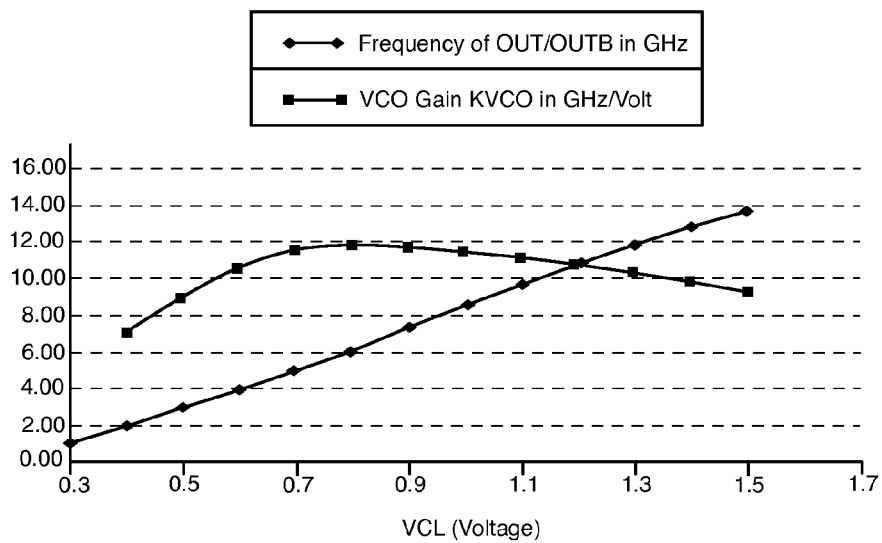
FIG. 3 is a graph that illustrates the frequency response and the gain of the VCO shown in FIG. 1.
Figure 6:
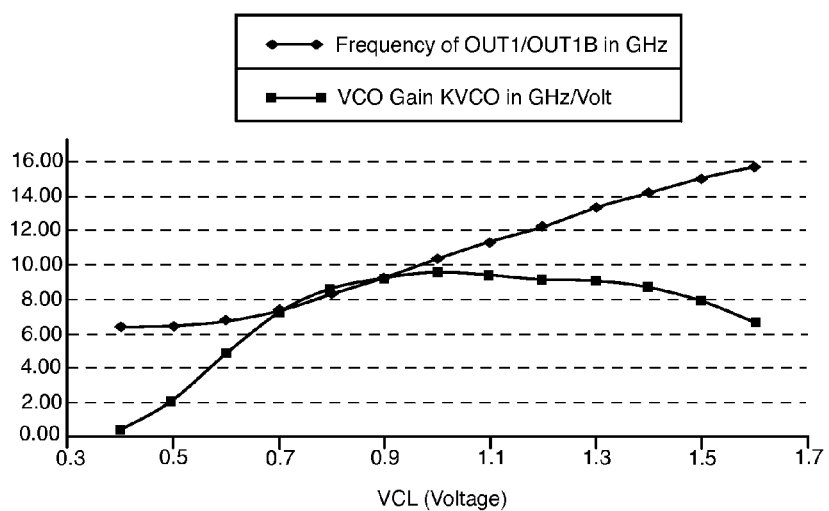
FIG. 6 is a graph that illustrates examples of the frequency response and the gain of the VCO shown in FIG. 4.

FIG. 6 is a graph that illustrates examples of the frequency response and the gain of VCO 408 shown in FIG. 4. The frequency tuning range for the differential output clock signal OUT1/OUT1B of VCO 408 varies from about 6.5 GHz to about 15.8 GHz in the example shown in the graph of FIG. 6. The frequency tuning range of VCO 408 is substantially reduced compared to the frequency tuning range of VCO 104 shown in FIG. 3. The minimum frequency of VCO 408 (about 6.5 GHz) is substantially larger than the minimum frequency of VCO 104 (about 1 GHz). The gain (KVCO) of VCO 408 has a maximum value of about 9.6 GHz/volt, compared to a maximum gain of about 12 GHz/volt for VCO 104. The reduction in gain allows VCO 408 to generate significantly less jitter in its output clock signals than VCO 104.

The VCO cell of FIG. 5 causes VCO 408 to be less sensitive to noise in the oscillator supply voltage VOS. Charge pump reference spurs that are caused by non-idealities in the switches in charge pump 402 are reduced in the output clock signals of VCO 408.

As data rates increase, the PLLs in data transmission systems need to generate clock signals with larger frequencies for sampling data transmitted at higher data rates. If the minimum frequency of the VCO output clock signals remains the same, while the maximum frequency of the VCO output clock signals increases, the gain of the VCO increases, and the VCO generates more jitter in its output clock signals. VCO 408 shown in FIGS. 4-5 generates substantially less jitter in its output clock signals at greater frequencies, because VCO 408 has a reduced gain and a reduced tuning range. In general, a wide VCO tuning range is desirable, but a wide VCO tuning range causes increased VCO gain.

Larger transistors can tolerate more voltage stress than smaller transistors. As transistor sizes are reduced, the voltage range of the control voltage in a phase-locked loop is reduced to prevent breakdown of the transistor in the voltage buffer 404. A reduction in the voltage range of the control voltage increases the gain of a VCO in a PLL. VCO 408 reduces the VCO gain or limits the increase in the VCO gain that occurs when the control voltage range of VCL is reduced to prevent a significant increase in the jitter in the VCO output clock signals.

In some embodiments, VCO 408 provides at least an octave of tuning range in its output clock signals. An octave of tuning range refers to the maximum frequency that VCO 408 can generate in its output clock signals being two times the minimum frequency that VCO 408 can generate in its output clock signals. Frequency divider circuits can be used to divide the frequency of the output clock signals of VCO 408 to generate clock signals having a wide continuous range of frequencies that support a wide range of data rates in a data transmission system. FIG. 6 illustrates the frequency response for an example implementation of VCO 408 that provides at least an octave of tuning range in its output clock signals.

Figure 7:
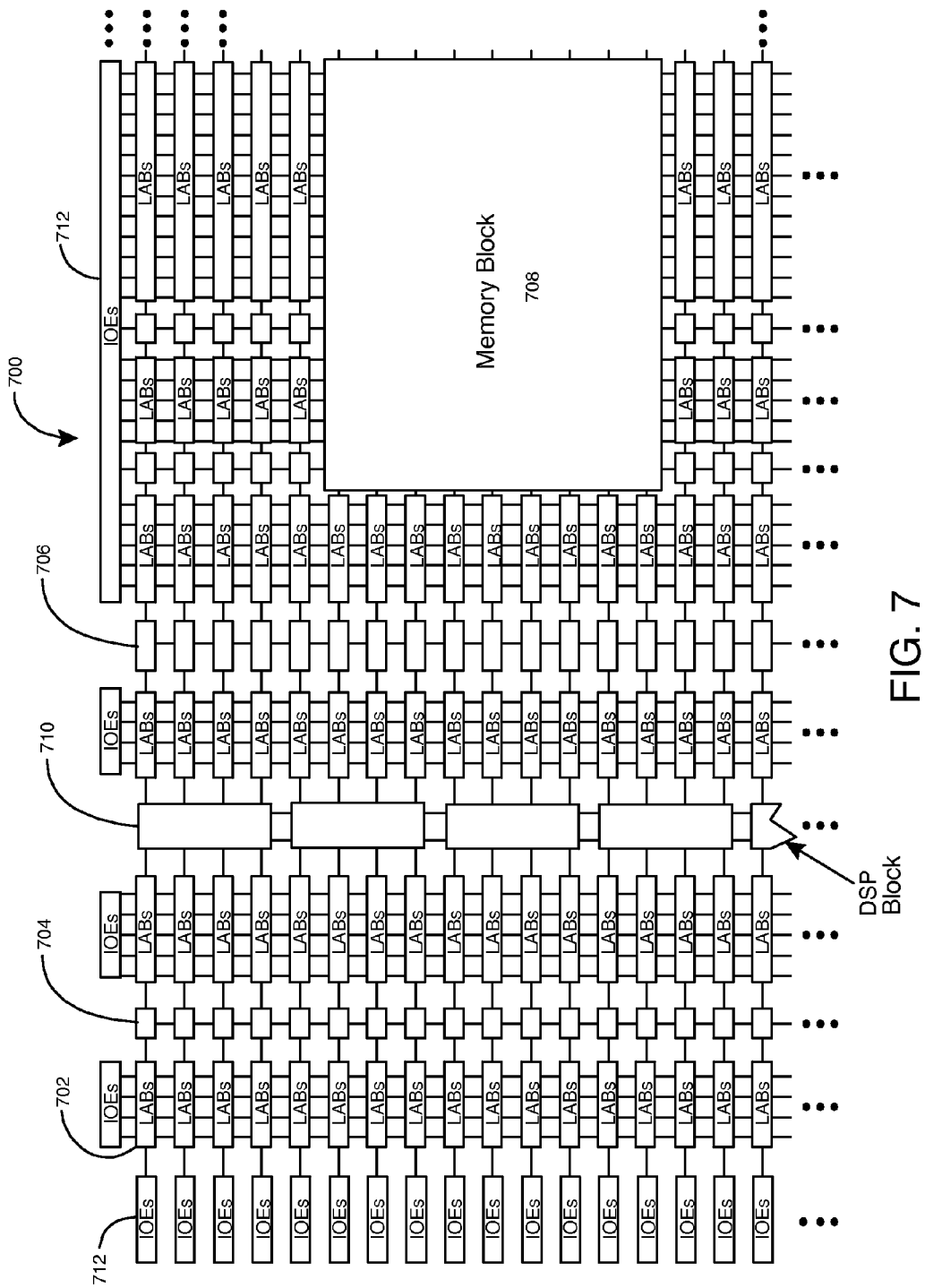
FIG. 7 is a simplified partial block diagram of a field programmable gate array (FPGA) that can include aspects of the present invention.

FIG. 7 is a simplified partial block diagram of a field programmable gate array (FPGA) 700 that can include aspects of the present invention. FPGA 700 is merely one example of an integrated circuit that can include features of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), application specific integrated circuits (ASICs), memory integrated circuits, central processing units, microprocessors, analog integrated circuits, etc.

FPGA 700 includes a two-dimensional array of programmable logic array blocks (or LABs) 702 that are interconnected by a network of column and row interconnect conductors of varying length and speed. LABs 702 include multiple (e.g., 10) logic elements (or LEs).

An LE is a programmable logic circuit block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 700 also includes a distributed memory structure including random access memory (RAM) blocks of varying sizes provided throughout the array. The RAM blocks include, for example, blocks 704, blocks 706, and block 708. These memory blocks can also include shift registers and first-in-first-out (FIFO) buffers.

FPGA 700 further includes digital signal processing (DSP) blocks 710 that can implement, for example, multipliers with add or subtract features. Input/output elements (IOEs) 712 located, in this example, around the periphery of the chip, support numerous single-ended and differential input/output standards. IOEs 712 include input and output buffers that are coupled to pads of the integrated circuit. The pads are external terminals of the FPGA die that can be used to route, for example, input signals, output signals, and supply voltages between the FPGA and one or more external devices. It is to be understood that FPGA 700 is described herein for illustrative purposes only and that the present invention can be implemented in many different types of integrated circuits.

Figure 8:
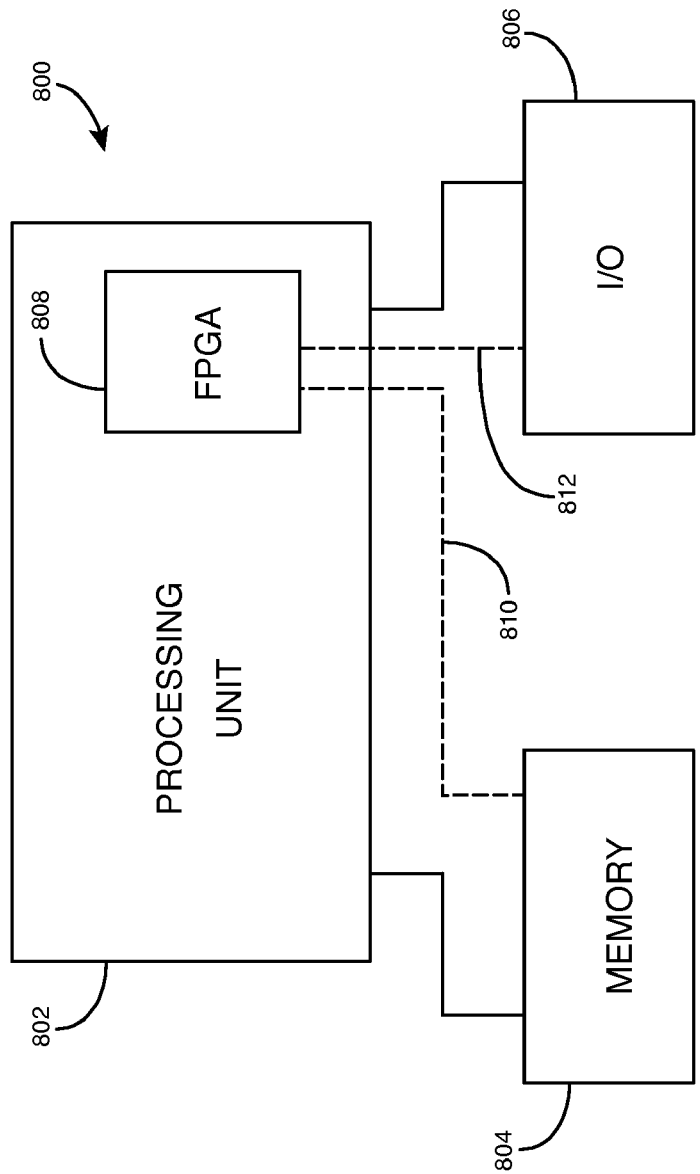
FIG. 8 shows a block diagram of an exemplary digital system that can embody techniques of the present invention.

The present invention can also be implemented in a system that has an FPGA as one of several components. FIG. 8 shows a block diagram of an exemplary digital system 800 that can embody techniques of the present invention. System 800 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 800 can be provided on a single board, on multiple boards, or within multiple enclosures.

System 800 includes a processing unit 802, a memory unit 804, and an input/output (I/O) unit 806 interconnected together by one or more buses. According to this exemplary embodiment, an FPGA 808 is embedded in processing unit 802. FPGA 808 can serve many different purposes within the system of FIG. 8. FPGA 808 can, for example, be a logical building block of processing unit 802, supporting its internal and external operations. FPGA 808 is programmed to implement the logical functions necessary to carry on its particular role in system operation. FPGA 808 can be specially coupled to memory 804 through connection 810 and to I/O unit 806 through connection 812.

Processing unit 802 can direct data to an appropriate system component for processing or storage, execute a program stored in memory 804, receive and transmit data via I/O unit 806, or other similar functions. Processing unit 802 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 808 can control the logical operations of the system. As another example, FPGA 808 acts as a reconfigurable processor that can be reprogrammed as needed to handle a particular computing task. Alternatively, FPGA 808 can itself include an embedded microprocessor. Memory unit 804 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. An oscillator circuit comprising:
    differential variable delay circuits coupled together to form a ring oscillator, wherein each of the differential variable delay circuits comprises first and second inputs and first, second, third, and fourth transistors, wherein a constant supply voltage is provided to sources of the first and the second transistors in each of the differential variable delay circuits, wherein a variable supply voltage is provided to sources of the third and the fourth transistors in each of the differential variable delay circuits, wherein gates of the first and the third transistors are coupled to the first input, wherein gates of the second and the fourth transistors are coupled to the second input, and wherein the oscillator circuit generates is operable to generate a periodic output signal having a frequency that varies based on changes in the variable supply voltage; and
    a fifth transistor operable to generate the constant supply voltage at a source of the fifth transistor based on a programmable input voltage.

2. The oscillator circuit of claim 1 wherein each of the differential variable delay circuits further comprises sixth and seventh cross-coupled transistors, wherein a drain of the sixth transistor is coupled to drains of the first and the third transistors, and wherein a drain of the seventh transistor is coupled to drains of the second and the fourth transistors.

3. The oscillator circuit of claim 1 wherein each of the differential variable delay circuits further comprises sixth and seventh transistors, wherein a drain of the sixth transistor is coupled to drains of the first and the third transistors, wherein a gate of the sixth transistor is coupled to the first input, wherein a drain of the seventh transistor is coupled to drains of the second and the fourth transistors, and wherein a gate of the seventh transistor is coupled to the second input.

4. The oscillator circuit of claim 1 wherein the oscillator circuit is part of a phase-locked loop circuit.

5. The oscillator circuit of claim 1 wherein the oscillator circuit is in a programmable logic integrated circuit.

6. An oscillator circuit comprising:
    differential variable delay circuits coupled together to form a ring oscillator, wherein each of the differential variable delay circuits comprises first and second inputs and first, second, third, and fourth transistors, wherein a constant supply voltage is provided to sources of the first and the second transistors in each of the differential variable delay circuits, wherein a variable supply voltage is provided to sources of the third and the fourth transistors in each of the differential variable delay circuits, wherein gates of the first and the third transistors are coupled to the first input, wherein gates of the second and the fourth transistors are coupled to the second input, and wherein the oscillator circuit is operable to generate a periodic output signal having a frequency that varies based on changes in the variable supply voltage,
    wherein each of the differential variable delay circuits further comprises fifth and sixth transistors, wherein a drain of the fifth transistor is coupled to drains of the first and the third transistors, wherein a gate of the fifth transistor is coupled to the first input, wherein a drain of the sixth transistor is coupled to drains of the second and the fourth transistors, and wherein a gate of the sixth transistor is coupled to the second input,
    wherein each of the differential variable delay circuits further comprises seventh and eighth cross-coupled transistors, wherein a drain of the seventh transistor is coupled to the drain of the fifth transistor, and wherein a drain of the eighth transistor is coupled to the drain of the sixth transistor.

7. The oscillator circuit of claim 6 wherein sources of the fifth and the seventh transistors are coupled together, and wherein sources of the sixth and the eighth transistors are coupled together.

8. The oscillator circuit of claim 6 wherein a differential output signal of each of the differential variable delay circuits is generated at the drains of the fifth and the sixth transistors.

9. An oscillator circuit comprising:
differential variable delay circuits coupled together to form a ring oscillator, wherein each of the differential variable delay circuits comprises first and second inputs and first, second, third, and fourth transistors, wherein a constant supply voltage is provided to sources of the first and the second transistors in each of the differential variable delay circuits, wherein a variable supply voltage is provided to sources of the third and the fourth transistors in each of the differential variable delay circuits, wherein gates of the first and the third transistors are coupled to the first input, wherein gates of the second and the fourth transistors are coupled to the second input, and wherein the oscillator circuit is operable to generate a periodic output signal having a frequency that varies based on changes in the variable supply voltage,
wherein a first voltage buffer is operable to provide the variable supply voltage to the oscillator circuit using current supplied from an input supply source in response to a variable control voltage, and wherein the oscillator circuit is operable to generate a minimum frequency of oscillation in the periodic output signal using the constant supply voltage when the first voltage buffer blocks current from the input supply source through the third and the fourth transistors.

10. The oscillator circuit of claim 9 wherein a second voltage buffer is operable to provide current from the input supply source to the oscillator circuit to generate the constant supply voltage.

11. A phase-locked loop circuit comprising:
phase detection circuitry operable to generate a control voltage that varies based on changes in a phase difference between first and second clock signals;
a first voltage buffer operable to generate a variable supply voltage that is based on the control voltage using current supplied from a supply source; and
variable delay circuits coupled together to form a ring oscillator, wherein the variable supply voltage is provided to first and second transistors in each of the variable delay circuits, wherein a constant supply voltage is provided to third and fourth transistors in each of the variable delay circuits, and wherein the ring oscillator is operable to generate a minimum frequency of oscillation in a periodic output signal using the constant supply voltage when the first voltage buffer blocks current from the supply source to the first and the second transistors.

12. The phase-locked loop circuit defined in claim 11 wherein each of the variable delay circuits comprises first and second inputs, wherein the variable supply voltage is provided to sources of the first and the second transistors, wherein the constant supply voltage is provided to sources of the third and the fourth transistors, wherein gates of the first and the third transistors are coupled to the first input, and wherein gates of the second and the fourth transistors are coupled to the second input.

13. The phase-locked loop circuit defined in claim 12 wherein each of the variable delay circuits further comprises fifth and sixth transistors, wherein a drain of the fifth transistor is coupled to drains of the first and the third transistors, wherein a gate of the fifth transistor is coupled to the first input, wherein a drain of the sixth transistor is coupled to drains of the second and the fourth transistors, and wherein a gate of the sixth transistor is coupled to the second input.

14. The phase-locked loop circuit defined in claim 13 wherein each of the variable delay circuits further comprises seventh and eighth cross-coupled transistors, wherein a drain of the seventh transistor is coupled to the drain of the fifth transistor, wherein a drain of the eighth transistor is coupled to the drain of the sixth transistor, and wherein sources of the fifth, the sixth, the seventh, and the eighth transistors are coupled together.

15. The phase-locked loop circuit defined in claim 11 further comprising:
a second voltage buffer operable to generate the constant supply voltage based on a programmable input voltage.

16. The phase-locked loop circuit defined in claim 11 wherein the phase detection circuitry comprises a phase frequency detector, a charge pump coupled to an output of the phase frequency detector, and a loop filter coupled to an output of the charge pump.

17. A method for generating a periodic signal, the method comprising:
generating a control voltage that varies based on changes in a phase difference between first and second clock signals;
generating a variable supply voltage that is based on the control voltage using a voltage buffer that conducts current from an input supply source;
providing the variable supply voltage to first and second transistors within each of multiple variable delay circuits;
providing a constant supply voltage to third and fourth transistors within each of the variable delay circuits; and
generating oscillations in a periodic output signal using the variable delay circuits, wherein the variable delay circuits are coupled to form a ring oscillator, and wherein the ring oscillator uses the constant supply voltage to generate a minimum frequency of oscillation in the periodic output signal when the voltage buffer blocks current from the input supply source through the first and the second transistors in each of the variable delay circuits.

18. The method defined in claim 17 wherein the variable supply voltage is provided to sources of the first and the second transistors, wherein the constant supply voltage is provided to sources of the third and the fourth transistors, wherein gates of the first and the third transistors are coupled to a first input in each of the variable delay circuits, and wherein gates of the second and the fourth transistors are coupled to a second input in each of the variable delay circuits.

19. A variable delay circuit comprising:
a first transistor having a source at a constant supply voltage and a gate coupled to a first input of the variable delay circuit;
a second transistor having a source at the constant supply voltage and a gate coupled to a second input of the variable delay circuit;
a third transistor having a source at a variable supply voltage and a gate coupled to the first input of the variable delay circuit;
a fourth transistor having a source at the variable supply voltage and a gate coupled to the second input of the variable delay circuit;

a fifth transistor having a drain coupled to drains of the first and the third transistors and a gate coupled to the first input of the variable delay circuit;

a sixth transistor having a drain coupled to drains of the second and the fourth transistors and a gate coupled to the second input of the variable delay circuit, wherein a delay of the variable delay circuit varies based on changes in the variable supply voltage; and seventh and eighth cross-coupled transistors, wherein a drain of the seventh transistor is coupled to the drain of the fifth transistor, and wherein a drain of the eighth transistor is coupled to the drain of the sixth transistor.

20. The variable delay circuit of claim 19 wherein sources of the fifth and the seventh transistors are coupled together, and wherein sources of the sixth and the eighth transistors are coupled together.

* * * * *